United States Patent
Ogino et al.

(10) Patent No.: US 7,299,315 B2
(45) Date of Patent: Nov. 20, 2007

(54) CONTROL DEVICE INCLUDING CONNECTING DEVICE FOR REWRITING MEMORY REGION

(75) Inventors: Kouji Ogino, Minami-Alps (JP); Eiichi Kubo, Yamanashi-ken (JP)

(73) Assignee: Nisca Corporation, Minamikoma-Gun, Yamanashi-Ken (JP)

( * ) Notice: Subject to any disclaimer, the term of this patent is extended or adjusted under 35 U.S.C. 154(b) by 521 days.

(21) Appl. No.: 10/815,923

(22) Filed: Apr. 2, 2004

(65) Prior Publication Data

US 2005/0060484 A1 Mar. 17, 2005

(30) Foreign Application Priority Data

Apr. 2, 2003 (JP) .................. 2003-099603
Apr. 2, 2003 (JP) .................. 2003-099604

(51) Int. Cl.
G06F 12/00 (2006.01)
(52) U.S. Cl. ................ 711/103; 711/163; 711/154
(58) Field of Classification Search ........... 711/103, 711/154, 163, 164
See application file for complete search history.

(56) References Cited

U.S. PATENT DOCUMENTS 6,505,280 B2 * 1/2003 Terada et al. ............ 711/164

2004/0015948 A1 * 1/2004 Sueyoshi et al. ......... 717/170

FOREIGN PATENT DOCUMENTS

| JP | 08-030517 | 2/1996 |
| JP | 09-305394 | 11/1997 |
| JP | 10-333992 | 12/1998 |
| JP | 11-234491 | 8/1999 |

OTHER PUBLICATIONS

"Information On Reprogramming Capability #73-65-13 (Mar. 6, 1997)," General Motors Corp., Doc. ID # 248550, 4 pgs.*

* cited by examiner

Primary Examiner—Pierre-Michel Bataille
(74) Attorney, Agent, or Firm—Manabu Kanesaka

(57) ABSTRACT

A control device includes a connecting device for connecting an external memory medium; and a non-volatile memory device having at least one memory region in which data can be electrically rewritten. The memory device includes a first memory region for storing control program data; a second memory region for storing connection judgment program data; and a third memory region for storing writing program data. The connection judgment program is executed to determine whether the external memory medium is connected. The writing program is executed to rewrite the control program data stored in the first memory region with external memory medium data stored in the external memory medium.

8 Claims, 12 Drawing Sheets

Fig. 5

Address Map

| Addresses | Assigned Area | |
|---|---|---|
| 0000~00FF | SFR Area | |
| 0100~02FF | Internal RAM Area | |
| 0300~03FF | Memory Area C | EEPROM Area |
| 0400~08FF | Memory Area B | |
| 0900~0FFF | Memory Area A | |
| 1000~12FF | Not Used | |
| 1300~13FF | Memory Area F | EPROM Area |
| 1400~18FF | Memory Area E | |
| 1900~1FFF | Memory Area D | |

Fig. 12

```
add    data
 00    ...
 01    ...
 ...   ...
 0D    FF
 0F    FF           FFFF   ←Check Data 1 (Sum of Address 10 to
                                         1F+ Check Data 2)
=================== add    data
 10    01
 11    01           0101
-------------------
 12    00
 13    05           0005
-------------------
 14    EA
 15    01           EA01
-------------------
 16    05
 17    10           1005
-------------------
 18    00
 19    00           0000
-------------------
 1A    C0
 1B    00           C000
-------------------
 1C    31
 1D    10           3110
-------------------
 1E    03
 1F    21           0321
-------------------
     Sum Value 2AD3F⇒AD3F  (Digits Beyond 16 Bits are Deleted.)
=============================
 20    52
 21    C0           52C0   ←Check Data 2
-------------------
 22    AD
 23    3F           AD3F   ←Bit Inverted Value of Check Data 2
```

CONTROL DEVICE INCLUDING CONNECTING DEVICE FOR REWRITING MEMORY REGION

BACKGROUND OF THE INVENTION AND RELATED ART STATEMENT

The present invention relates to a control device equipped with an electrically erasable programmable read only memory (EEPROM) or a flash memory capable of electronically writing and erasing a program and data for controlling an electronic device in commercial and industrial use.

Conventionally, program data stored in an EPROM (electrically programmable read only memory) have been widely used for controlling an operation of an electronic device. The EPROM is a non-volatile type memory, and can store data even after the power is turned off. Therefore, the EPROM is suitable for a memory device for storing a program or reference data for executing a program. In the EPROM, it is not possible to electrically erase the stored content and to write a new program or data. Accordingly, when the program or data is changed, it is necessary to replace with the EPROM having the new program or data.

For this reason, recently in the technical field of a control device for controlling an electronic device in commercial and industrial use, there has been widely used a single chip microcomputer (hereinafter referred to as single chip computer), in which a CPU and an EEPROM or a flash memory are arranged in an integrated circuit on one chip. In the single chip computer, it is not necessary to connect to an external RAM or ROM. Accordingly, it is possible to access to an internal memory at a high speed. The single chip computer also has superior resistance against a line noise from an external source and an irradiated noise.

The EEPROM and flash memory, i.e. an improved EEPROM, (hereinafter, the EEPROM and flash memory are referred simply as EEPROM) are non-volatile memories capable of storing data even without electrical power similar to the EPROM described above. Accordingly, the EEPROM can store data that requires backup in case of power outage such as a program and function setting data of the CPU for controlling a device. Also, as opposed to the EPROM, the EEPROM is cable of electrically writing or erasing data. Accordingly, it is easy to write a program data when the program or setting data needs to correct a program bug or to upgrade.

Therefore, in the control device, an external device with an external memory medium wherein a writing program is stored is connected to a control substrate provided with the single chip computer. Then, an operator manually operates a dipswitch to execute the writing program stored in the external memory medium to write a program and data.

When a program in the EEPROM on the single chip computer is written, it is necessary to provide a dedicated apparatus for writing, thereby making it difficult to handle.

In order to solve this problem, Japanese Patent Publication (Kokai) No. 11-234491 has disclosed a control device in which a socket is provided on a substrate for mounting an EPROM for storing a writing program, so that the writing program stored in the EPROM is executed manually through an external operation. In the conventional control device, it is necessary to select a mode switch through the manual operation to execute the writing operation using the CPU arranged in the single chip computer, thereby making the operation troublesome.

When the single chip computer is not connected to a writing unit or the EPROM, an error may occur in executing the writing process through the manual operation, thereby making it troublesome to handle the writing unit or EPROM. In the EEPROM, when a new program and setting data are written, it is necessary to confirm whether the new program and setting data are written correctly through the writing process.

Japanese Patent Publication (Kokai) No. 08-30517 has disclosed a method for verifying whether a new program, data and setting data for writing are correctly written to the EEPROM. According to the method, a data region for storing a program and data, and a check region corresponding to the data region for storing check data to check the program and data are formed in a memory area of the EEPROM. In the control program for controlling the writing process to the EEPROM, a step is provided for obtaining a sum of the new programs and data to be stored in the data region whenever the EEPROM data is changed. A result obtained in the step is compared to the check data stored in the check region, so that it is verified that the new program and data stored in the data region are written correctly.

As disclosed in Japanese Patent Publication (Kokai) No. 10-333992, the EEPROM is provided therein with a data region for storing a program and data, a check region for storing check data for checking the program and data, and an adjusting data region for storing adjusting data preset such that the check data become specific values relative to a device. The specific values are compared to data obtained by adding the adjusting data to a sum of a first byte of the new program or data stored in the data region, so that it is verified whether the new program and data are suitable for the device.

In the verification method described above, when the writing is interrupted, there is a problem that it is determined that the writing is conducted correctly despite the interruption depending on the new programs and data.

In the verification method disclosed in Japanese Patent Publication (Kokai) No. 08-30517, when the writing suddenly stops during the writing process for the new program or data, the check data in the EEPROM is cleared, or FF is written in an 8-bit register. Accordingly, when the sum of the newly written program and data is FF, it is difficult to verify whether the writing is conducted correctly.

In the verification method disclosed in Japanese Patent Publication (Kokai) No. 10-333992, when the sum of the data interrupted while writing and matches to sum of the data when written correctly, i.e. the adjusted value of FF, it is difficult to verify whether the writing is conducted correctly.

An erroneous program or data due to the failed writing is executed as the correct program and data. In this case, the device may not operate correctly, or may operate in an uncontrolled state to cause damage, thereby causing a problem.

In view of the problems described above, an object of the present invention is to provide a control device for writing a control program and data, in which it is automatically verified that the program and data in an EEPROM are in a state that the program and data can be rewritten.

Another object of the present invention is to provide a control device capable of determining whether the program and data are written correctly and whether the writing operation is completed correctly when the program and data to be stored in EEPROM are rewritten.

Further objects and advantages of the invention will be apparent from the following description of the invention.

SUMMARY OF THE INVENTION

In order to achieve the objects described above, a control device includes connecting means for connecting an external memory medium; and non-volatile memory means having at least one memory region in which data can be electrically rewritten. The memory means includes a first memory region for storing control program data; a second memory region for storing connection judgment program data; and a third memory region for storing writing program data. The connection judgment program is executed to determine whether the external memory medium is connected. The writing program is executed to rewrite the control program data stored in the first memory region with the external memory medium data stored in the external memory medium.

Accordingly, it is possible to automatically detect that the external memory medium is connected. When it is detected that the external memory medium is connected, the control program data stored in the external memory medium is automatically written to the memory means in the control device, thereby making it easy to write data to the memory means on the control device.

Further, a fourth memory region may be provided for storing compatibility judgment program data for determining whether the external memory medium data are correct and compatible to the device. The apparatus executes the connection judgment program to confirm that the external memory medium is connected, and executes the compatibility judgment program to confirm that the external memory medium data stored in the external memory means are correct. Then, the writing program is executed to write all or a portion of the operation control program data stored in the first memory region of the memory means according to the external memory medium data stored in the external memory medium.

Accordingly, it is automatically determined that the external memory medium is connected and the external memory medium data stored in the external memory means are correct before the writing program is executed. The writing program is executed according to the result of the judgment. As a result, it is possible to write only the operation control program data compatible with the electronic device, and only the correct operation control program data to the memory means in the control device.

Further, the control device may be provided with a first judging means for judging whether the data written to the memory means are correct, and a second judging means for judging whether the writing means writes the data to the memory means correctly. Accordingly, when the data in the memory region of the memory means are replaced with the data of the external memory medium, it is possible to confirm that the operation control program data are written correctly after the writing process and that the writing process is completed normally, thereby controlling the electronic device using only the correct operation control programs.

BRIEF DESCRIPTION OF THE DRAWINGS

FIG. 5 is a diagram showing an address map of a memory region to which a CPU of the control unit accesses in the automatic document feeder according to the embodiment of the present invention;

FIG. 12 is a data map for explaining check data for checking the writing operation in the control unit of the automatic document feeder according to the embodiment of the present invention.

DETAILED DESCRIPTION OF PREFERRED EMBODIMENTS

Figure 1:
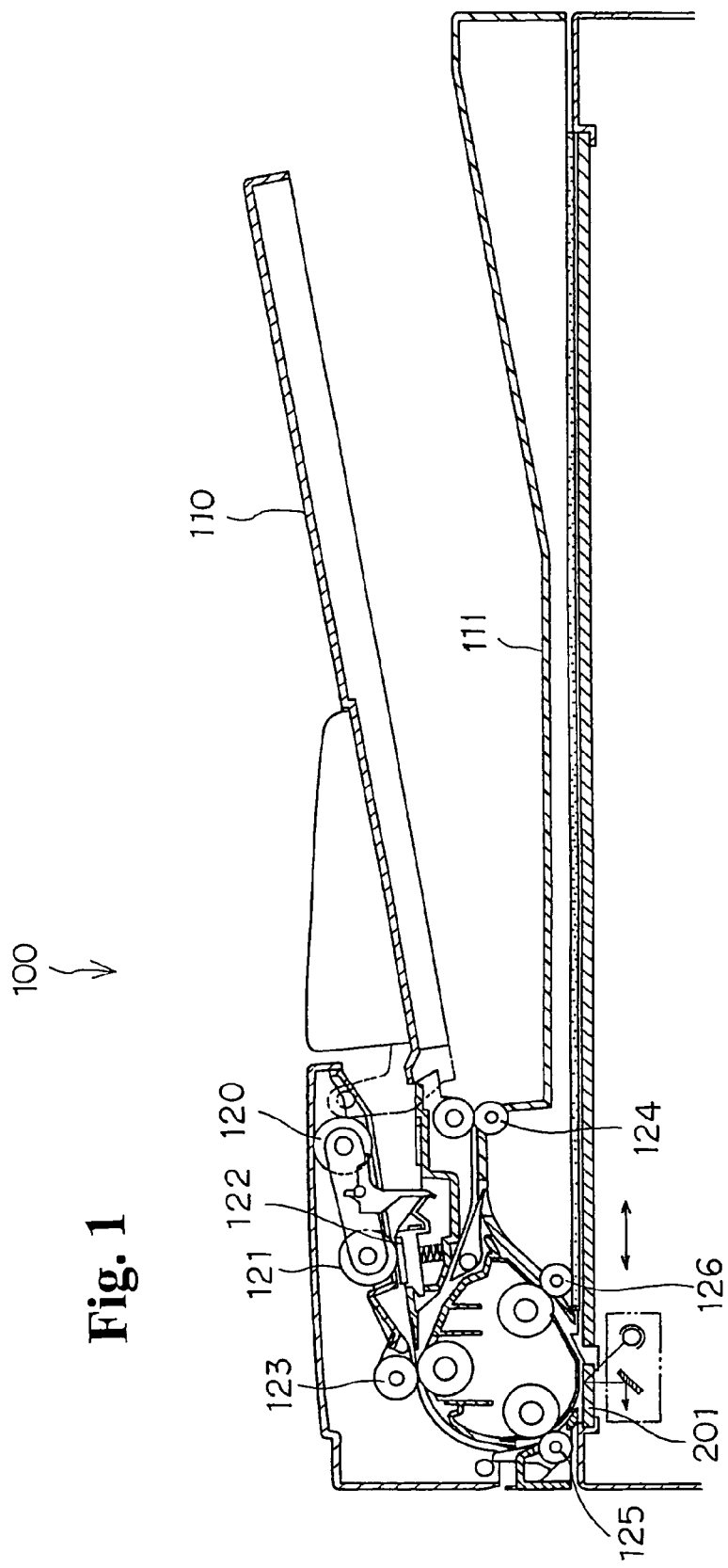
FIG. 1 is a sectional view showing an automatic document feeder according to an embodiment of the present invention.
Figure 2:
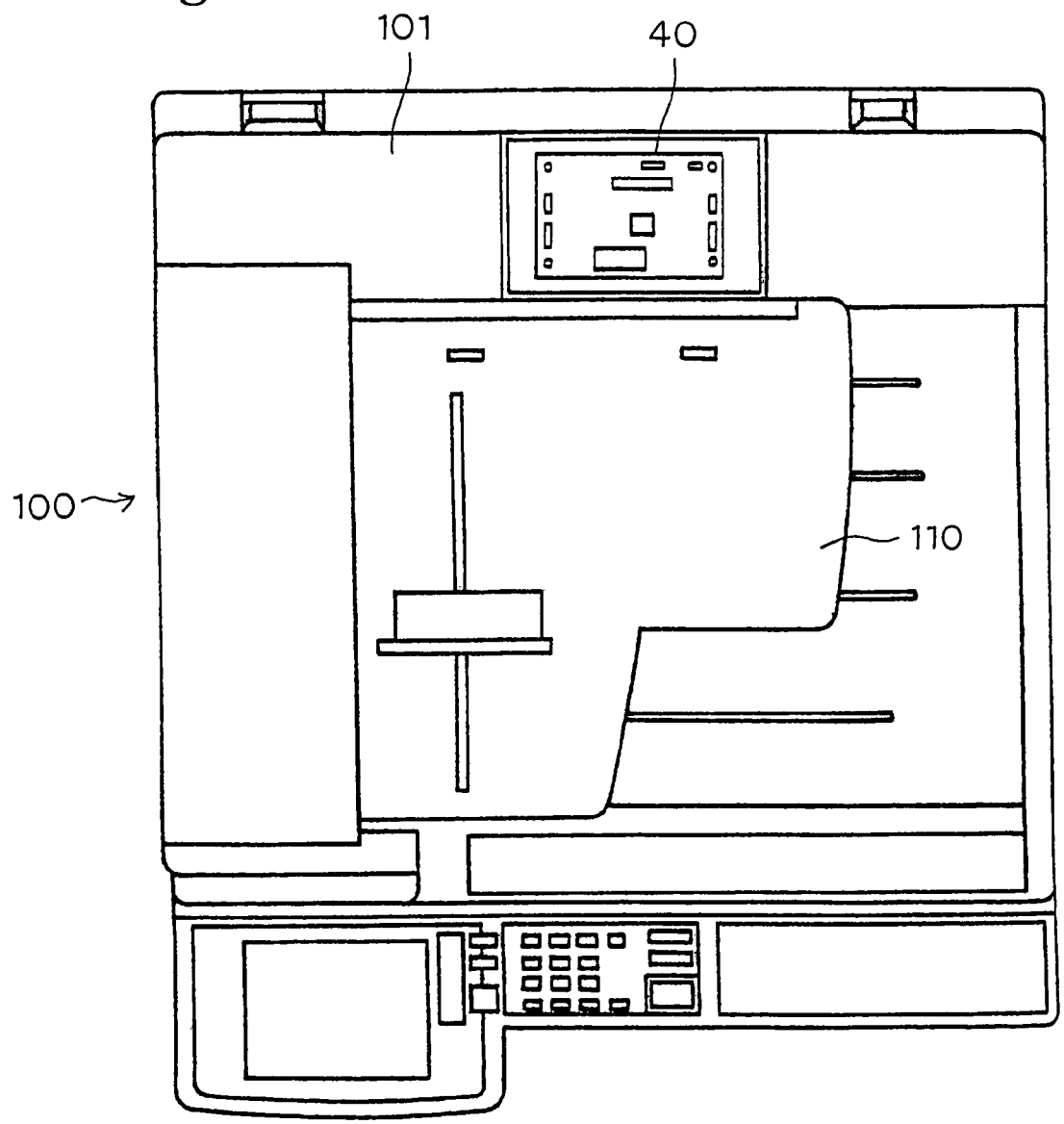
FIG. 2 is a plan view showing the automatic document feeder according to the embodiment of the present invention in a state that a portion of an external cover is removed from the automatic document feeder and a control substrate with a single chip computer (control unit) mounted thereupon is exposed.

Hereunder, embodiments of the present invention will be explained with reference to the accompanying drawings. An automatic document feeder is an example of an electronic device with an EEPROM. FIG. 1 is a sectional view of the automatic document feeder according to the embodiment of the present invention. FIG. 2 is a plan view showing the automatic document feeder according to the embodiment of the present invention in a state that a portion of an external cover is removed from the automatic document feeder and a control substrate with a single chip computer (control unit) mounted thereupon is exposed.

As shown in FIG. 1, an automatic document feeder 100 picks up an original stacked on a sheet stacking tray 110 using a kick roller 120. The paper feed roller 121 and separating member 122 separate the originals into a single sheet. After the original is aligned with a pair of register rollers 123, the original is transported to a platen glass 201, and is read at a reading position on the platen glass 201. The original is discharged to a discharge tray 111 with a pair of discharge rollers 124. A pair of transport rollers 125 transports the original to the platen glass 201. A pair of transport rollers 126 transports the original from the platen glass 201.

As shown in FIG. 2, the automatic document feeder 100 is equipped with a control substrate 40 on an outer cover 101 thereof. The control substrate 40 is mounted with a single chip computer (control unit 30), an electrical circuit (not shown) such as a drive circuit for operating a motor to drive the rollers, and an IC socket 41 to which an EPROM 34 is mounted as an external memory medium. The EPROM 34 (described later) is easily mounted to or dismounted from the IC socket 41 on the control substrate 40 by removing a portion of the external cover 101.

Figure 3:
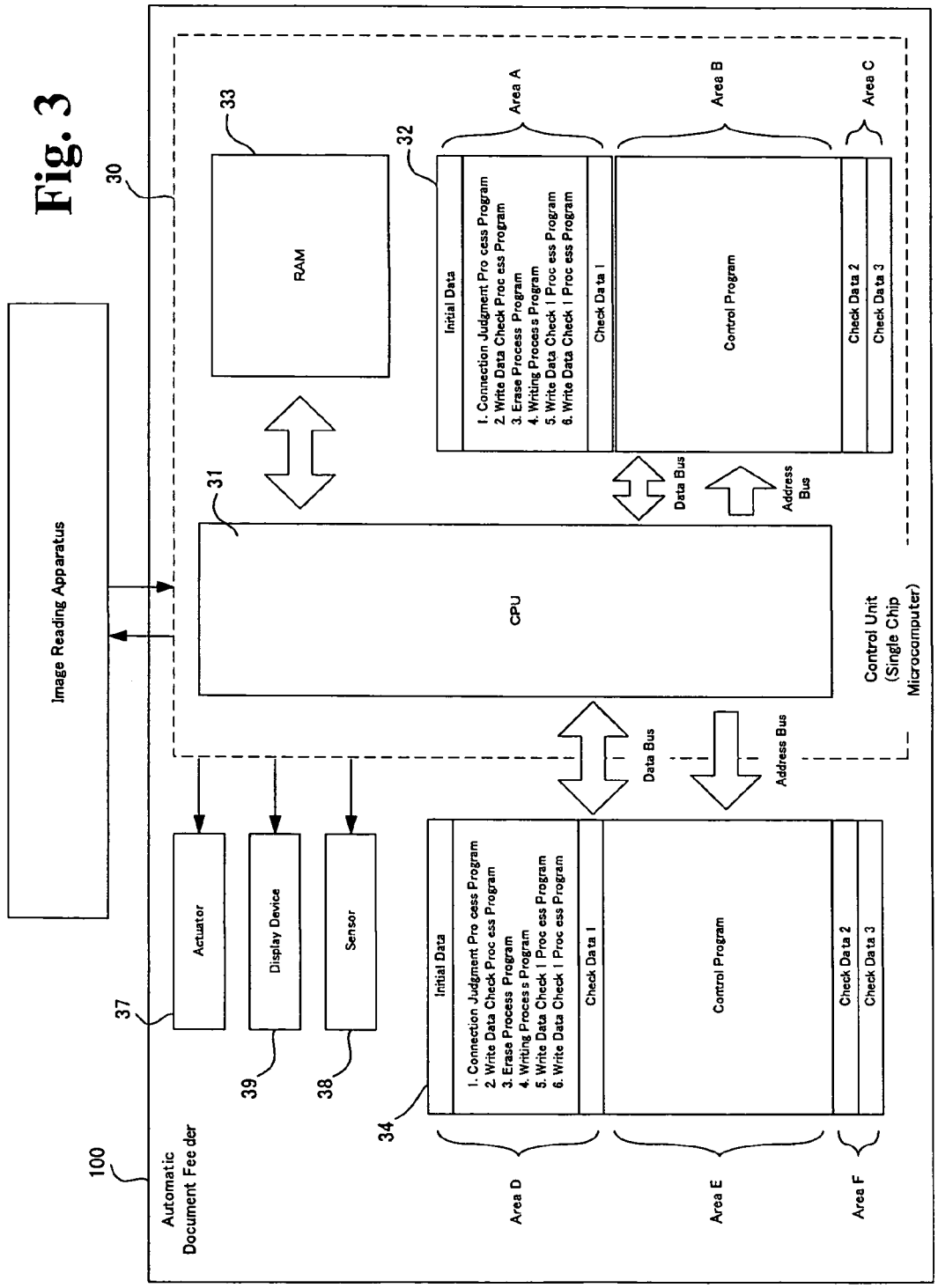
FIG. 3 is a block diagram showing the control unit of the automatic document feeder and a surrounding structure thereof according to the embodiment of the present invention.
Figure 4:
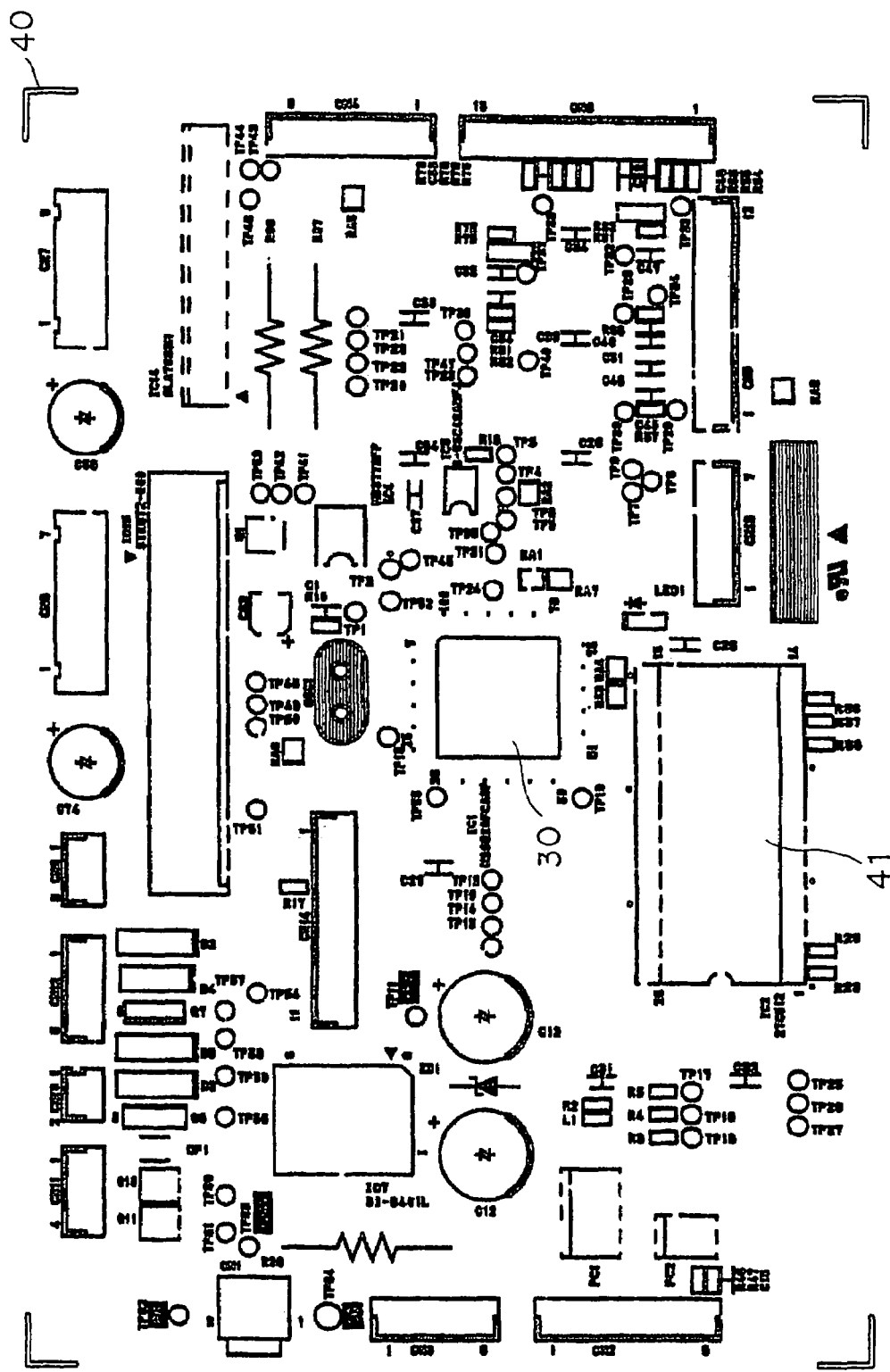
FIG. 4 is a view showing a control substrate with the single chip computer mounted thereon of the automatic document feeder according to the embodiment of the present invention.

FIG. 3 is a block diagram showing the control unit of the automatic document feeder and a surrounding structure thereof according to the embodiment of the present invention. FIG. 4 is a view showing a control substrate with the single chip computer mounted thereon of the automatic document feeder according to the embodiment of the present invention. The control unit 30 and the surrounding structure will be explained in detail with reference to FIG. 3 and FIG. 4.

The control unit 30 is formed of a single chip computer with a peripheral LSI and a memory formed therein. The control unit 30 is equipped with a CPU 31 for controlling the device to be controlled; an EEPROM 32 (memory that electrically writes a control program) for storing various control programs for executing operations; and a RAM 33 for temporarily storing data generated during a process in the CPU 31 and a signal from a plurality of sensors 38 or an image reading apparatus. The single chip computer 30 is mounted on a printed circuit board 40 as shown in FIG. 4.

An EPROM 34 is provided for storing a new control program to be written to the control program in the EEPROM 32. Specifically, the EPROM 34 is an external memory medium for storing data for writing. When it is necessary to write the new program to the EEPROM 32, the EPROM 34 is mounted on the IC socket 41 on the printed circuit board 40 shown in FIG. 4. The CPU31 is configured to access to the EPROM 34 via an address bus and data bus. The CPU 31 executes the control program stored in the EEPROM 32 based on information from each of the sensors 38 or an external device (not shown) to control a display apparatus 39 for displaying a status of an actuator 37 such as a motor and the device.

The EEPROM 32 and the EPROM 34 will be explained next in detail. The EEPROM 32 is a flash memory capable of electrically writing a program and data as described above. As shown in FIG. 3, the EEPROM 32 is provided with storage areas, i.e. an area A for storing initial data, an area B for storing a control program, and an area C for storing various check data. The area A is a protected area, and stores various programs to be executed when the power is turned on and not to be rewritten. The startup program stored in area A includes an initial program for initial processing; a connection judgment processing program for determining whether the EPROM 34 is mounted on the IC socket 41; a writing data check processing program for checking whether the new data stored in EPROM 34 is compatible when the control program is written; a delete processing program for deleting the control program stored in the EEPROM 32; a writing program for writing the data of the new control program stored in an area E in the EPROM 34 to the area B in the EEPROM 32; a first writing data check processing program for checking whether the data is written correctly after the control program is written; and a second writing data check processing program for checking the control program when the power is turned on. An error-processing program is also stored for displaying an error when the error occurs in the programs.

The EEPROM 32 stores check data 1 in the area A for verifying the control program data using the first writing data check processing program and the second writing data check processing program. A variety of other programs and data are stored in the area A to operate the device without hindrance. A variety of control programs and data are stored in the area B of EEPROM 32 for executing operations. An erase processing program and a write processing program are executed to erase content of the control programs in a state that the EPROM 34 is mounted in the IC socket 41 on the printed circuit board, and the new control program stored in the area E in the EPROM is written to the area B.

The area C in the EEPROM 32 is a memory region for storing the check data for determining whether the written control program is correct, i.e. check data 2 for adjusting the check data 1 described above, and check data 3 for determining whether the check data 2 are correct. The check data stored in the area C are written every time when the area B control program is written.

As shown in FIG. 3, the EPROM 34 has three memory regions, i.e. area D, area E and area F, similar to the EEPROM 32. The area D is a memory region for storing the same type of data as in the area A in the EEPROM 32. The data are used for determining the connection of the EEPROM 32 (described later) and the compatibility of the apparatus to the control program for writing stored in the area E.

A control program (new control program) for writing is stored in the area E. Note that various other data for operating the device are included along with the programs for executions of the device. The programs and data are written to the area B in the EEPROM 32.

The area F stores the check data such as the new check data 2 and check data 3 corresponding to the control program for writing in the area E. The check data are used for checking the control program in the area B in the EEPROM 32 written with the contents in the area E in the EPROM 34. Note that the check data are set when the control program for writing is created.

In the embodiment of the invention, the printed circuit board is provided with circuits for starting up the IC socket 41 and the EPROM 34. The EPROM 34 is mounted on the IC socket 41, so that it is easy to write to the EEPROM 32. A writing unit with the EPROM 34 mounted thereon may be connected to the single chip computer 30 on the print circuit board through a connecting member such as a connector from outside. The EPROM 34 is provided for storing the programs and writing data as the external memory medium. Alternatively, it is possible to use other storage media such as a memory card, a memory stick, or a storage apparatus such as a personal computer.

An address map allocated by the CPU 31 will be explained next. FIG. 5 is a diagram showing an address map of a memory region to which a CPU of the control unit accesses in the automatic document feeder according to the embodiment of the present invention. Addresses 0000h to 00FFh are assigned to a function register region. Addresses 0100h to 02FFh are assigned to the RAM 33. Addresses 0300h to 0FFFh are assigned to the EEPROM 32. Addresses 1300h to 1FFFh are assigned to the EPROM 34.

FIG. 6 to FIG. 11 are flow charts showing a writing operation using a control program in the automatic document feeder according to the embodiment of the present invention. A process of writing with the control program in the automatic document feeder according to the embodiment of the present invention will be described with reference to FIG. 6 to FIG. 11.

When the power is turned on, an I/O board is initialized (ST100). The connection judgment processing program is executed to determine whether the writing data storage device EPROM 34 is connected to the I/O board (ST101). At this time, the connection judgment processing program stored in the area A is read out and temporarily stored in the RAM 33.

Figure 7:
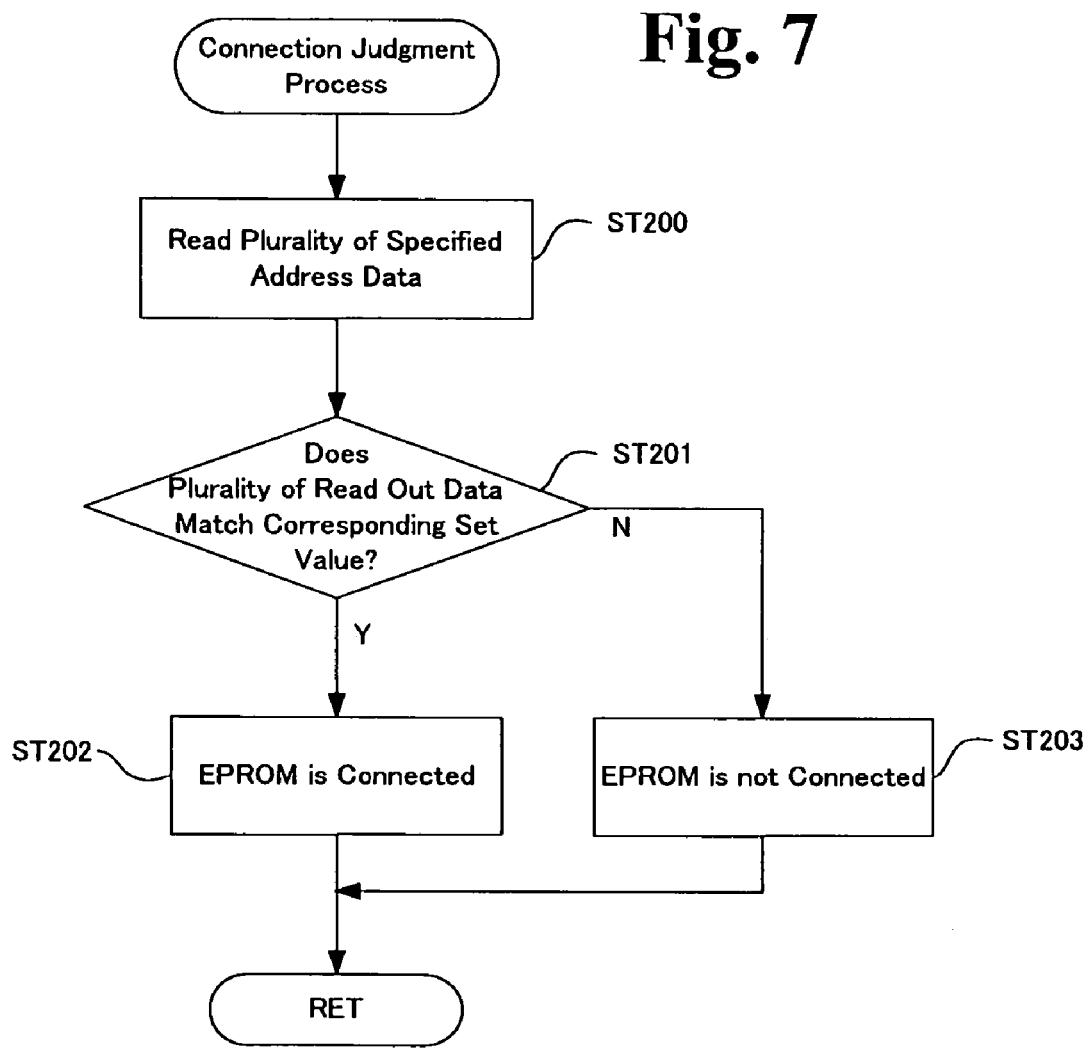
FIG. 7 is a flow chart showing the writing operation using the control program in the automatic document feeder according to the embodiment of the present invention.

As shown in FIG. 7, in the connection judgment process, the area D in the EPROM 34, specifically a plurality of specific addresses in the region assigned to the addresses of 1900 h to 1FFF, is accessed to determine whether the data of the specified addresses match the predetermined connection judgment values (ST200 to ST201). When the EPROM 34 is mounted on the IC socket 41, data matching the predetermined values are read. When the EPROM 34 is not mounted on the IC socket 41, data different from the predetermined values are read. In the embodiment, when the EPROM 34 is not mounted, the single chip computer input port is pulled up, so that FFFF is read.

The same data are stored in the area D in the EPROM 34 and the area A in the EEPROM 32. Accordingly, the data in the EEPROM 32 at addresses thereof corresponding to the specified addresses in the EPROM 34 are used as the connection judgment values. The data at the corresponding addresses in the EEPROM 32 are compared with the data at the specified addresses in the EPROM 34 to determine whether the EPROM 34 is mounted on the IC socket 41. When the data at the specified addresses in the EPROM 34 match the predetermined values, it is determined that the EPROM 34 is connected (ST202). When not match, it is determined that the EPROM 34 is not connected (ST203).

Accordingly, it is determined whether the ERROM 34 is connected. When it is determined that the EPROM 34 is connected, the writing mode is operated to write the control program. When it is determined that the EPROM 34 is not connected, the normal mode is operated to operate the device using the normal control program (ST102). In other words, depending on whether the EPROM 34 is mounted on the IC socket 41, it is automatically determined whether the writing mode is operated, and the program is automatically written.

Figure 8:
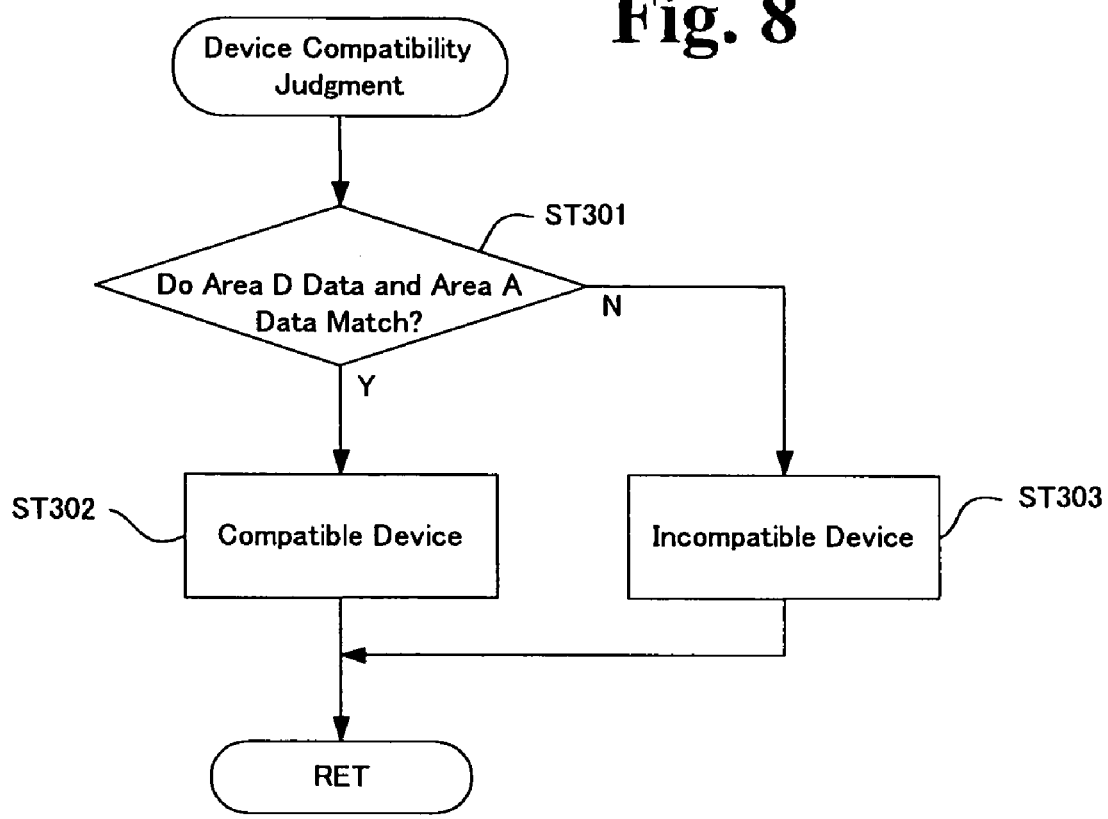
FIG. 8 is a flow chart showing the writing operation using the control program in the automatic document feeder according to the embodiment of the present invention.

In the writing mode, the display apparatus 39 displays that the program is writing (ST103). The apparatus compatibility judgment process is operated to verify that the control program stored in the area E in the EPROM 34 is compatible with the main apparatus and is a correct control program (ST104). As shown in FIG. 8, the apparatus compatibility judgment process determines whether the data in the area D in the EPROM 34 match that in the area A in the EEPRM 32 (ST301). When the data match, it is determined that the control program in the area E in the EPROM 34 is compatible with the apparatus (ST302). When the data do not match, it is determined that the control program in the area E in the EPROM 34 is incompatible with the apparatus (ST303).

When the apparatus is different from a normal apparatus, at least one of the actuator such as the motor to drive the apparatus, the sensors, the control circuits and the single chip computer is different. Accordingly, all the data in the area D in the EPROM 34 do not match that in the area A in the EEPRM 32. Therefore, by comparing all the data in the area D in the EPROM 34 to that in the area A in the EEPRM 32, it is possible to determine whether the control program stored in the area E in the EPROM 34 is compatible with the apparatus.

When the control program is determined to be incompatible with the apparatus at ST105, an error is displayed (ST180) and the writing operation stops. When it is determined that the control program is compatible at ST105, the content in the area A in the EEPROM 32 is read and temporarily stored in the RAM 33 (ST106). The program stored in the RAM 33 is executed to perform the writing operation.

Figure 9:
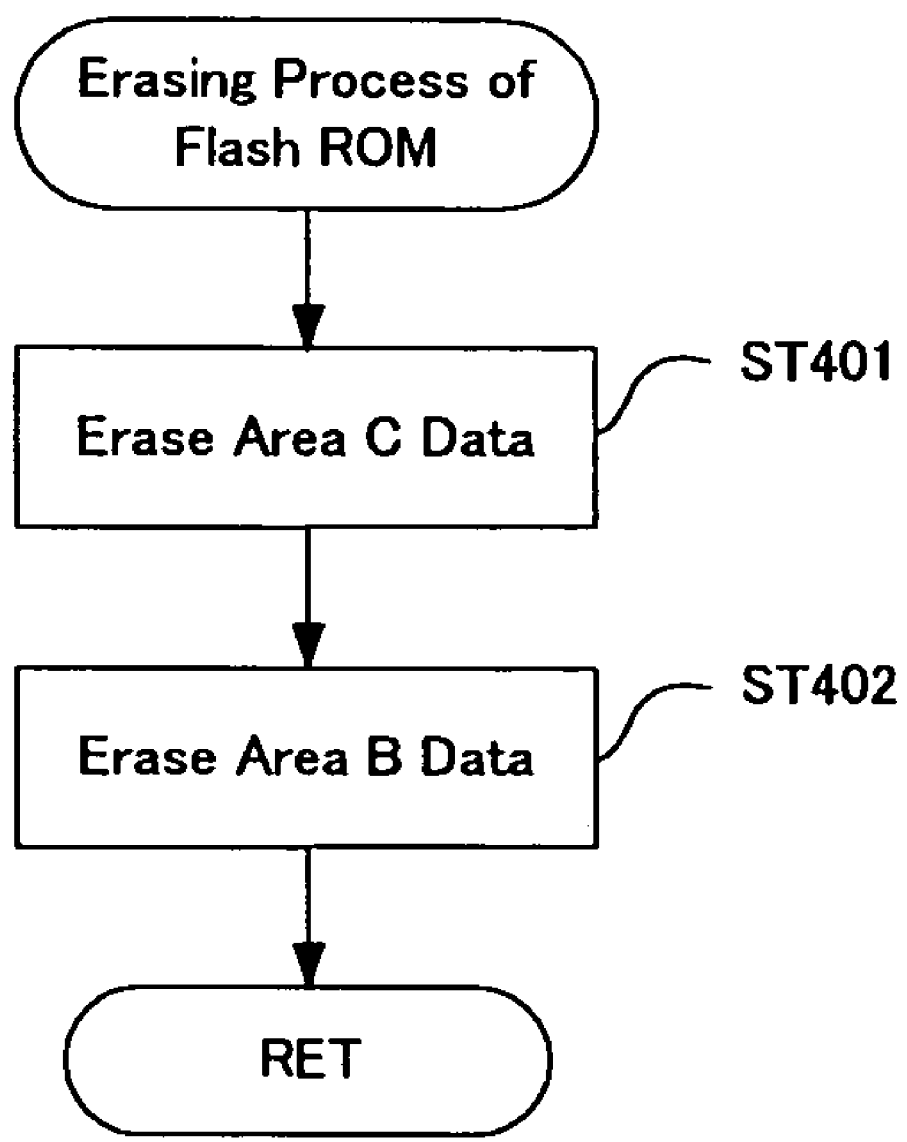
FIG. 9 is a flow chart showing the writing operation using the control program in the automatic document feeder according to the embodiment of the present invention.

In the writing operation, the erasing process is executed to erase the data in the area B and area C in the EEPROM 32 (ST107). The erasing process is executed to erase the content of the area B first, then that of the area C as shown in FIG. 9 (ST401 to ST402). The content of the area B is erased after that of the area C is erased. Accordingly, it is possible to securely determine whether the program is written correctly after the power is restored, if there is power outage during the erasing process. In the erasing process in the embodiment, all data in the areas B and C is written as FFFFh.

Next, the new control program data in the area E in the EPROM 34 is read according to the address and written to the area B in the EEPROM 32 (ST108). Accordingly, the control program data are written to the area B in the EEPROM 32. When the writing of the control program data to EEPROM 32 is completed, the writing data check 1 process is executed (ST109). In the writing data check 1 process, it is determined whether the control program is correctly written to the area B in the EEPROM 32.

Figure 10:
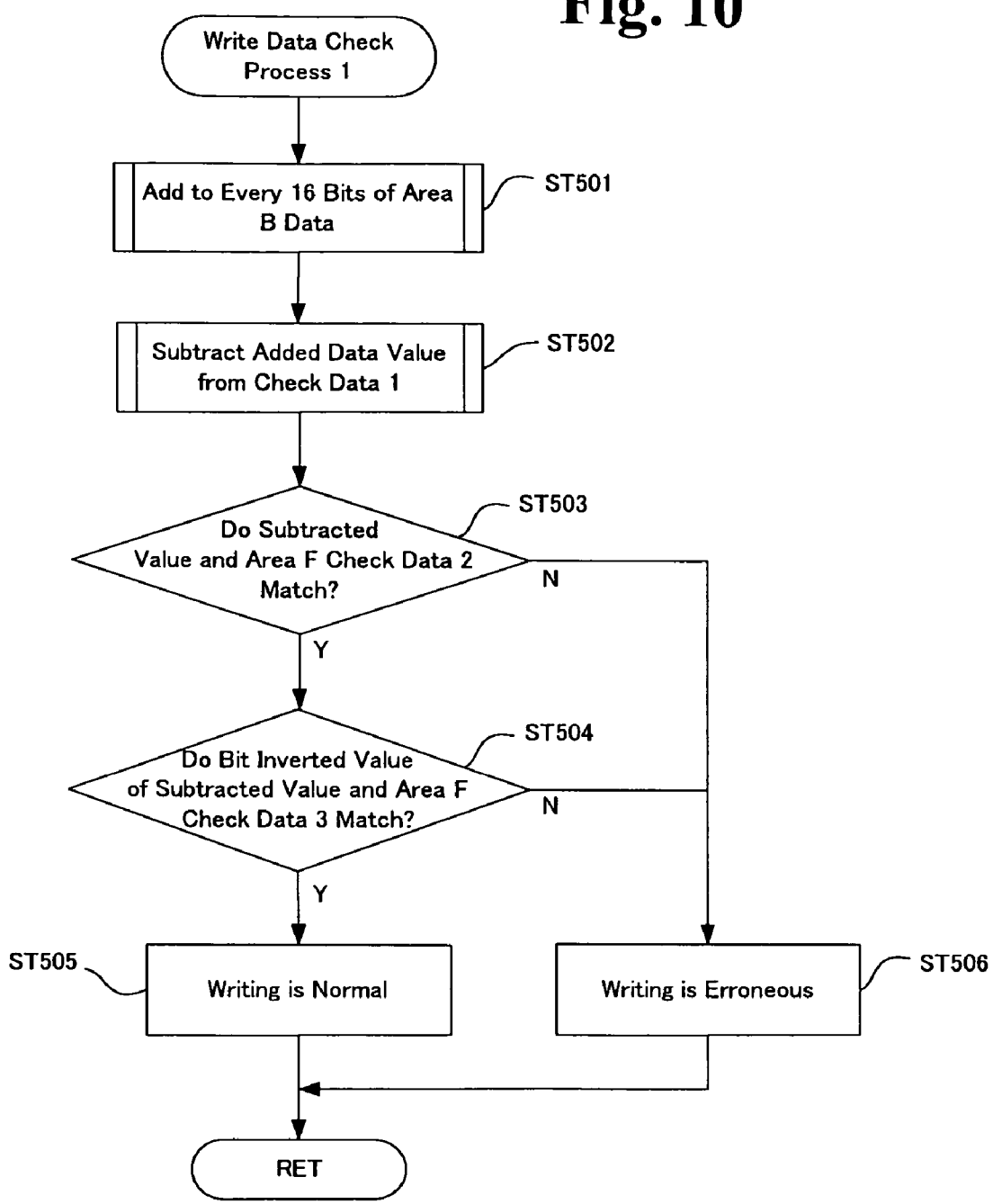
FIG. 10 is a flow chart showing the writing operation using the control program in the automatic document feeder according to the embodiment of the present invention.
Figure 11:
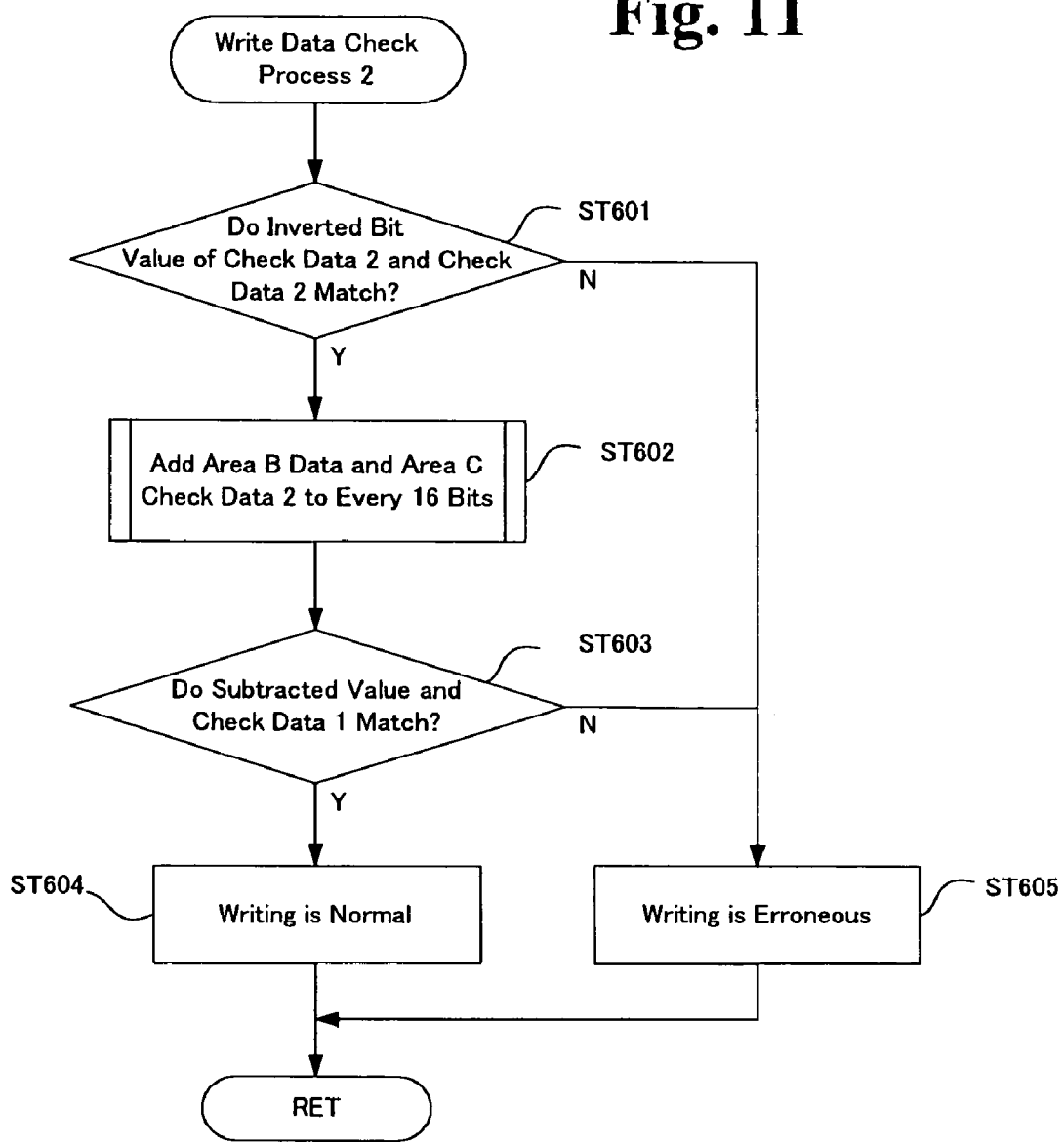
FIG. 11 is a flow chart showing the writing operation using the control program in the automatic document feeder according to the embodiment of the present invention.

As shown in FIG. 10, the stored control program data are added to the content written to the area B per 16 bits, and the sum of the area B per 16 bits is calculated (ST501). The 16 bits sum value is subtracted from the check data 1 in the area A (ST502). The subtracted value is compared with the check data 2 in the area F in the EPROM 34 (ST503). When the subtracted value does not match, it is determined that the control program is not written correctly and there is a writing error (ST506). When the subtracted value matches, the subtracted value is processed through bit conversion to obtain converted data, and the check data 3 in the area F in the EPROM 34 are compared to the converted date (ST504). When the check data 3 match, it is determined that the control program is written correctly (ST505) When the check data 3 in the EPROM 34 do not match, it is determined that the writing of the control program is erroneous (ST506).

When it is determined that the control program is written correctly to the area B in the EEPROM 32, the check data 2 and check data 3 in the area F in the EPROM 34 are written to the area C in the EEPROM 32 (ST110). It is displayed that the writing operation is completed (ST112). When the control program is not correctly written to the area B in the EEPROM 32, an error is displayed (ST113).

The check data 1 are specific values stored in the area A, i.e. a write protected area. The check data 2 are adjustment values for adjusting the check data 1 by adding the check data 2 to the sum value of all data in the area B. The check data 3 are the converted data in the check data 2.

Figure 6:
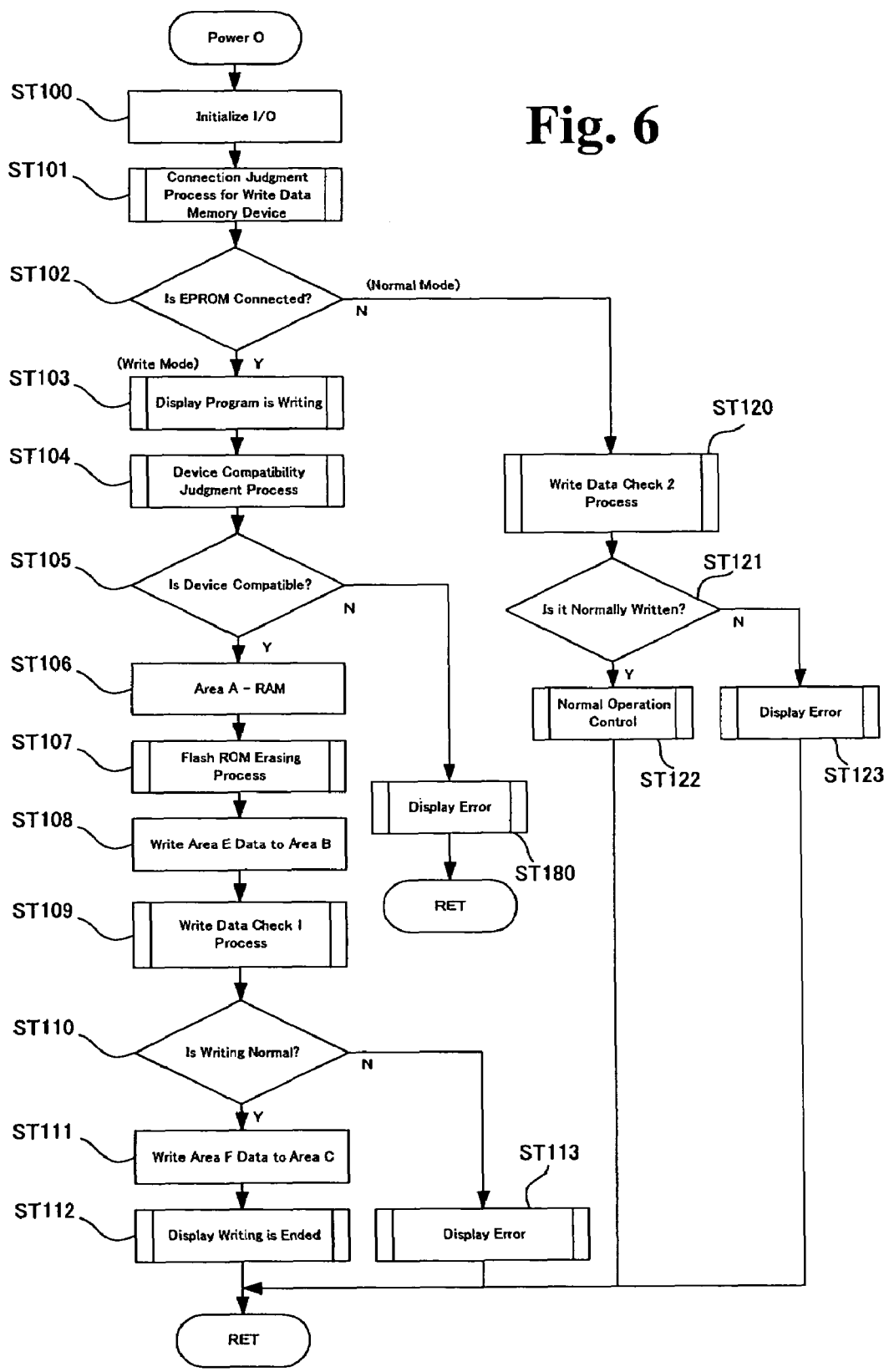
FIG. 6 is a flow chart showing a writing operation using a control program in the automatic document feeder according to the embodiment of the present invention.

When it is determined that the EPROM 34 is not connected and the normal mode is operated at ST102, as shown in FIG. 6, the writing data check 2 process is executed (ST120). In the writing data check 2 process at ST120, the converted data in the check data 2 are compared to the check data 3 to determine whether the check data 2 are correct. Accordingly, it is possible to determine that the erasing and writing processes are completed normally and the data is written correctly.

When it is determined that the converted data of the check data 2 match the check data 3 at ST601, it is determined that the check data 2 are correct, and the process moves to ST602. When the converted data of the check data 2 do not match, it is determined that the check data 2 are incorrect and the written data are erroneous (ST605). Accordingly, when the writing operation is interrupted while the new program or data is written and the power is supplied after removing the EPROM 34, the sum of the data when the writing operation is interrupted matches the sum of the data written normally. Even when the check data 2 are FFFF, the check data 3 are different from FFFF, so that it is possible to securely determine whether the data are written correctly all the way to the end.

When it is determined that the check data 2 are correct at ST601, the data in the area B and the check data 2 in the area C are added every 16 bits (ST602). The added data are compared to the check data 1 in the area A (ST603). When both values match, it is determined that the written data is correct (ST604). When they do not match, it is determined that the written data are erroneous (ST605). In other words, in the writing data check 2 process, the check data 2 and the sum data of the check data 2 and the control program data are checked to determine whether the control program is written correctly.

When it is determined that the control program and data are written correctly in the writing data check 2 at ST120, the control program is executed to startup the apparatus (ST122) When it is determined that the control program and data are not written correctly, an error is displayed and processing is stopped (ST123). Specifically, the first judging means is executed in the writing data check 2 process, in which it is determined whether the correct control program and data are stored in the EEPROM 32. The second judging means is executed in the process in which it is determined whether the erasing and writing processes of the control program and data in the EEPROM 32 are performed normally.

With reference to FIG. 12, the check data 1 to 3 will be explained. The control unit of the automatic document feeder uses the check data 1 to 3 for checking the writing operation. FIG. 12 is a data map to explain the check data. In the embodiment, among the storage areas in the EEPROM 32, the area A is assigned addresses of 00 to 0F; the area B is assigned addresses of 10 to 1F; and the area C is assigned addresses of 20 to 2F.

A value of FFFh is stored at the addresses of 00 to 0D in the area A as the check data 1. The data at the addresses 10 to 1F in the area B are added every 16 bits (2 bytes) to obtain the sum value equal to 2AD3Fh as data. Since the data are expressed in 16 bits, the highest position value '2' of the data is deleted, so that the sum value of the data in the area B is AD3Fh. The sum value (AD3Fh) is subtracted from the value of FFFFh stored in the area A as the check data 1 to obtain 52C0h, and 52C0h is stored at the addresses 20 to 21 in the area C as the check data 2.

When the power is turned on to execute the check data 2 process, and the check data 2 (52C0h) are added to the sum of the data in the area B (AD3Fh), the check data 2 return to the original FFFFh (stored in the area A as the check data 1). In other words, the check data 2 have a function of an adjustment value for verifying results of the calculations.

The check data 3 are stored at the addresses 22 to 23 in the area C and are AD3Fh, i.e. a converted value of the check data 2 (52C0h). The check data 3 (AD3Fh) check the check data 2.

According to the embodiment of the present invention, the predetermined connection judgment value to be compared to the data at a specified address in the connection judgment process is set as the prearranged data stored in the area A in the EEPROM. It is also possible to set the connection judgment check regions in the area A in the EEPROM and to the area D in the EPROM, and to access the connection judgment check region in the EPROM and read out the data. By comparing the data to the data in the connection judgment check region in the EEPROM, it can be determined whether the EPROM is connected to the IC socket 41.

According to the embodiment of the present invention, the check data 3 are the converted data of each bit of the check data 2. The system compares the data converted from each bit of the check data 2 and the check data 3 to determine whether the erasing and writing processes are completed normally when the power is turned on. When they match, the writing is completed normally. When they do not match, it is determined that there is an error in the writing process. It is also acceptable to write specific data in the area C, specifically data different from FFFFh, when the check data 3 are erased. Accordingly, it can be determined whether the writing is completed normally by determining whether the specific data written in the writing data check 2 process executed when the power is turned on match the predetermined data. Note that in this case, when executing the erasing process, the check data 2 are erased before erasing the check data 2 in the area C and area B. The writing is executed after writing the check data 2 to the area B and area C, when executing the writing process. Accordingly, it is possible to accurately determine whether the writing process is completed normally.

According to the embodiment of the present invention, the check data 1 specific to the device are preset in the area A in the EEPROM 32. The check data 2 are adjusted so that the sum of the control program data written to the area B matches the check data 1. The data written to the area B are checked. As shown in FIG. 12, while storing the sum value that operates the sum of the data written to the area C', the converted value of each bit of the sum value data is stored. Each time the power is turned on, it is determined whether the converted value of each bit of the sum value data and the sum value check data match. When they match, it is possible to determine whether the sum of the data stored in the area B and the sum value match. In this case, when the converted value for each bit of the sum value data and the sum value check data match, and the data sum stored in the area B and the sum value match, it is determined that the data are correctly written to the area B'. Note that in this case, the converted data for each bit of the check data 2 and the check data 3 are compared when determining whether the check data 2 are correct. It is also perfectly acceptable to add the check data 2 and the check data 3. When the result is FFFFh, it is determined that the check data 2 is correct, since the converted data for each bit of the check data 2 are the check data 3. When it is not FFFFh, the check data 2 are incorrect.

According to the embodiment, the converted data for each bit of the check data 2 are the check data 3. It is also acceptable to add or subtract a constant predetermined value to or from the check data 2 to obtain values as the check data 3. It is also acceptable to add a constant predetermined value to the sum value, in the same way as the sum value check data described above, or to use a value subtracted for the sum value check data. Specifically, it is preferable that the check data 3 be different from the check data 2 and have a specific relationship with the check data 2.

According to the embodiment of the present invention, the connection judgment processing program, the erasing process program and the writing process program are stored in the startup program area (area A) in the EEPROM 32 in the control unit 31 of the automatic document feeder 100. It is determined whether the EPROM 34 is mounted on the IC socket 41 when the power is turned on. When the EPROM 34 is connected, the erasing and writing operations are automatically performed on the writing area (area B) in the EEPROM 32, so that there is no need for a dedicated apparatus or operating means for specifying the writing operation when writing the EEPROM 32. The writing operation to the EEPROM 32 is performed automatically simply by mounting the EPROM 34 on the IC socket 41.

According to the embodiment of the present invention, in the check area in the EEPROM, the data for the first check for determining whether the written control program is correct, and the data for the second check used for determining whether the erasing and writing processes are completed normally are written when writing the control program. Based on the data for the second check, it is determined that the erasing and writing processes are completed normally and the data are written correctly. Then, it is determined whether the program written by the data of the first check stored in the first memory region is correct. Accordingly, it is possible to check whether the correct control program is written normally. Particularly, like the automatic document feeder 100, when a device is used as an option for other devices (such as a copier), it is easy to upgrade such as adding a new function according to an apparatus with the device, and it is possible to confirm an update of a control program.

While the invention has been explained with reference to the specific embodiments of the invention, the explanation is illustrative and the invention is limited only by the appended claims.

What is claimed is:

1. A control device for controlling an electronic device, comprising:
a socket to be connected to an external memory,
non-volatile storage memory means having a memory region with a portion where data can be electrically rewritten, said memory means having a first memory region for storing control program data for operating the electronic device, a second memory region for storing connection judgment program data to determine whether the external memory is connected to the socket, and a third memory region for storing writing program data to rewrite the control program data stored in the first memory region, and
control means electrically connected to the socket and memory means for executing a control program to control an operation of the electronic device, said control means initially executing the connection judgment program data, and when it is determined that the external memory is connected to the socket, the control means executing the writing program data so that at least a portion of the control program data stored in the first memory region of the memory means is rewritten to external memory medium data stored in the external memory.

2. A control device according to claim 1, wherein said control means executes the writing program when data stored in the external memory at a predetermined address thereof is read through executing the connection judgment program and the data matches predetermined data stored in the memory means.

3. A control device according to claim 1, wherein said control means executes operation control program based on the operation control program data stored in the first memory region when data stored in the external memory at a predetermined address thereof is read through executing the connection judgment program and the data does not match predetermined data stored in the memory means.

4. A control device according to claim 1, wherein said control means executes the connection judgment program when the control device is turned on.

5. A control device according to claim 1, wherein said memory means further includes a fourth memory region for storing compatibility judgment program data for determining whether the external memory medium data stored in the external memory means is compatible and correct, said control means executing the writing program so that at least a portion of the control program data stored in the first memory region in the memory means is rewritten based on the external memory medium data stored in the external memory medium when it is determined that the external memory is connected to the control device through executing the connection judgment program and that the external memory medium data stored in the external memory medium is correct through executing the compatibility judgment program.

6. A control device according to claim 5, wherein said control means outputs an error signal when it is determined that the external memory medium data stored in the external memory is incorrect through executing the compatibility judgment program.

7. An automatic document feeder comprising: feeding means for feeding original onto a platen, discharging means for discharging the original on the platen, and a control board for controlling the feeding means and the discharging means, said control board including the control device according to claim 1 and executing the connection judgment program when the control device is turned on.

8. A control device for controlling an operation of an electronic device, comprising:
a single chip computer having an EEPROM capable of electrically rewriting data therein,
a control board having said single chip computer thereon,
a socket mounted on the control board, to which an EPROM having a memory area with predetermined addresses assigned thereto is attached,
a bus for connecting the single chip computer and the EPROM through the socket,
rewriting means memorized in a boost area of the EEPROM and writing data memorized in the EPROM to a predetermined area of the EEPROM,
judgment means memorized in the boost area of the EEPROM and judging whether the EPROM is connected to the socket, and control means for executing the judgment means when the control device is turned on, said control means executing the rewriting means when it is judged that the EPROM is connected to the socket.

* * * * *